(12) United States Patent
Rubenchik et al.

(10) Patent No.: US 9,192,056 B2
(45) Date of Patent: Nov. 17, 2015

(54) METHODS AND SYSTEM FOR CONTROLLED LASER-DRIVEN EXPLOSIVE BONDING

(75) Inventors: Alexander M. Rubenchik, Livermore, CA (US); Joseph C. Farmer, Tracy, CA (US); Lloyd Hackel, Livermore, CA (US); Jon Rankin, Dublin, CA (US)

(73) Assignee: Lawrence Livermore National Security, LLC, Livermore, CA (US)

( * ) Notice: Subject to any disclaimer, the term of this patent is extended or adjusted under 35 U.S.C. 154(b) by 866 days.

(21) Appl. No.: 13/229,840

(22) Filed: Sep. 12, 2011

(65) Prior Publication Data

US 2013/0064993 A1    Mar. 14, 2013

(51) Int. Cl.
*C23C 14/30*  (2006.01)
*H05B 7/00*   (2006.01)
*H05K 3/14*   (2006.01)
*C23C 14/14*  (2006.01)
*C23C 14/28*  (2006.01)
*H05K 3/10*   (2006.01)

(52) U.S. Cl.
CPC  *H05K 3/14* (2013.01); *C23C 14/14* (2013.01); *C23C 14/28* (2013.01); *H05K 3/10* (2013.01); *H05K 2203/0528* (2013.01); *H05K 2203/107* (2013.01); *H05K 2203/1527* (2013.01)

(58) Field of Classification Search
CPC ........ C23C 14/14; C23C 14/28; C23C 14/48; C23C 14/3485
USPC ................... 427/596, 597, 554, 555
See application file for complete search history.

(56) References Cited

U.S. PATENT DOCUMENTS 4,752,455 A * 6/1988 Mayer .......................... 427/597
2008/0139075 A1* 6/2008 Birrell et al. ................... 445/61

* cited by examiner

*Primary Examiner* — Michael Wieczorek
(74) *Attorney, Agent, or Firm* — Kilpatrick Townsend

(57) ABSTRACT

A technique for bonding two dissimilar materials includes positioning a second material over a first material at an oblique angle and applying a tamping layer over the second martial. A laser beam is directed at the second material that generates a plasma at the location of impact on the second material. The plasma generates pressure that accelerates a portion of the second material to a very high velocity and towards the first material. The second material impacts the first material causing bonding of the two materials.

23 Claims, 5 Drawing Sheets

US 9,192,056 B2

METHODS AND SYSTEM FOR CONTROLLED LASER-DRIVEN EXPLOSIVE BONDING

STATEMENT AS TO RIGHTS TO INVENTIONS MADE UNDER FEDERALLY SPONSORED RESEARCH OR DEVELOPMENT

The United States Government has rights in this invention pursuant to Contract No. DE-AC52-07NA27344 between the U.S. Department of Energy and Lawrence Livermore National Security, LLC, for the operation of Lawrence Livermore National Laboratory.

BACKGROUND

Coatings are an essential component of modern, high performance systems and equipment. They can provide corrosion and corrosion cracking protection, extended wear, insulation, and voltage-standoff. However conventional techniques for coatings often result in less than desirable performance characteristics such as less than desired adhesion and low density. In other cases, desirable coatings cannot be applied because the available coating processes cannot achieve the desired phase, stoichiometry, or alloy structure.

Several techniques are currently available for deposition of one material over another or bonding of one material to another. For example, techniques such as physical vapor deposition (PVD), Chemical vapor deposition (CVD) and the like can be used to deposit very thin films over a substrate, typically a silicon or germanium-based substrate.

Several other deposition techniques such as anodizing, conversion coating, electroplating, ion beam mixing, etc. are currently used to deposit one material over another material.

Most of the current techniques have several disadvantages. First, the adhesion quality between the deposited material and the base material is often low, resulting in the peeling or general degradation of the deposited film/coating over a period of time or when the component is subjected to stress. Second, several of these techniques are not suitable for depositing refractory metals such as Tantalum, Tungsten, Vanadium, Niobium, and alloys thereof. Since the refractory metals are extraordinarily resistant to heat and often have a high melting point that makes them unsuitable for deposition using conventional techniques.

Thus, there is a need in the art for a deposition/coating process that provides high level of adhesion between the base material and the deposition material regardless of the type of base material and/or deposited material.

SUMMARY OF THE INVENTION

Embodiments of the present invention provide techniques for depositing one material over another that are applicable to a variety of types and alloy phase of materials, resulting in a coating that has high adhesion to the underlying material. Specifically, techniques provided herein use laser energy to accelerate a thin film of the material to be deposited to several hundred meters/sec resulting in the material hitting a substrate at an oblique angle and causing plastic deformation of the substrate at the location of impact. This generates very high pressure and increases the shear flow of material at the interface of the deposited material and the substrate, resulting in material intermixing with the substrate and thereby forming a strong bond between the deposited material and the underlying substrate.

In some embodiments, a method for coating a substrate is provided. The method comprises providing a substrate having an upper surface and an opposing lower surface and positioning a first material over the upper surface of the substrate at a first distance. The first material is positioned at an angle with respect to the upper surface of the substrate. The method further includes providing a tamping layer, which has a first thickness, over the first material, directing a laser beam to be incident at a first location of the first material for a first duration, generating a first pressure at an interface region between the tamping layer and the first material, accelerating the first material to a first velocity and towards the upper surface of the substrate, and depositing the first material on at least a first portion of the upper surface.

In another embodiment a method is provided. The method comprises providing a substrate having a surface, placing a film comprising a first material at a first distance from the surface of the substrate, flowing a liquid over the film and the substrate such that the liquid covers the film and at least a portion of the surface of the substrate, and providing laser energy at a first location of the film. The method further comprises generating a first pressure at an interface region of the liquid and the film, accelerating the first material at the first location to a first velocity, directing the first material at the first location towards the surface of the substrate, causing the first material at the first location to impact the surface of the substrate in a first region, and bonding the first material at the first location to the first region of the surface.

Some embodiments of the present invention provide a system that comprises a laser source, a substrate holder, a coating material holder, and a fluid dispenser assembly. The system is configured to hold a substrate using the substrate holder, hold the coating material at a first distance from the substrate and at a first angle with respect to the substrate, flow a liquid over the coating material using the fluid dispenser assembly, impinge a laser beam at a first location on the coating material, generate a plasma characterized by a first pressure at an interface region of the liquid and the coating material, accelerate a portion of the coating material at the first location to a first velocity, and cause bonding of the portion of the coating material at the first location to the substrate.

The following detailed description, together with the accompanying drawings will provide a better understanding of the nature and advantages of the embodiments of the present invention.

DETAILED DESCRIPTION OF SPECIFIC EMBODIMENTS

Figure 1:
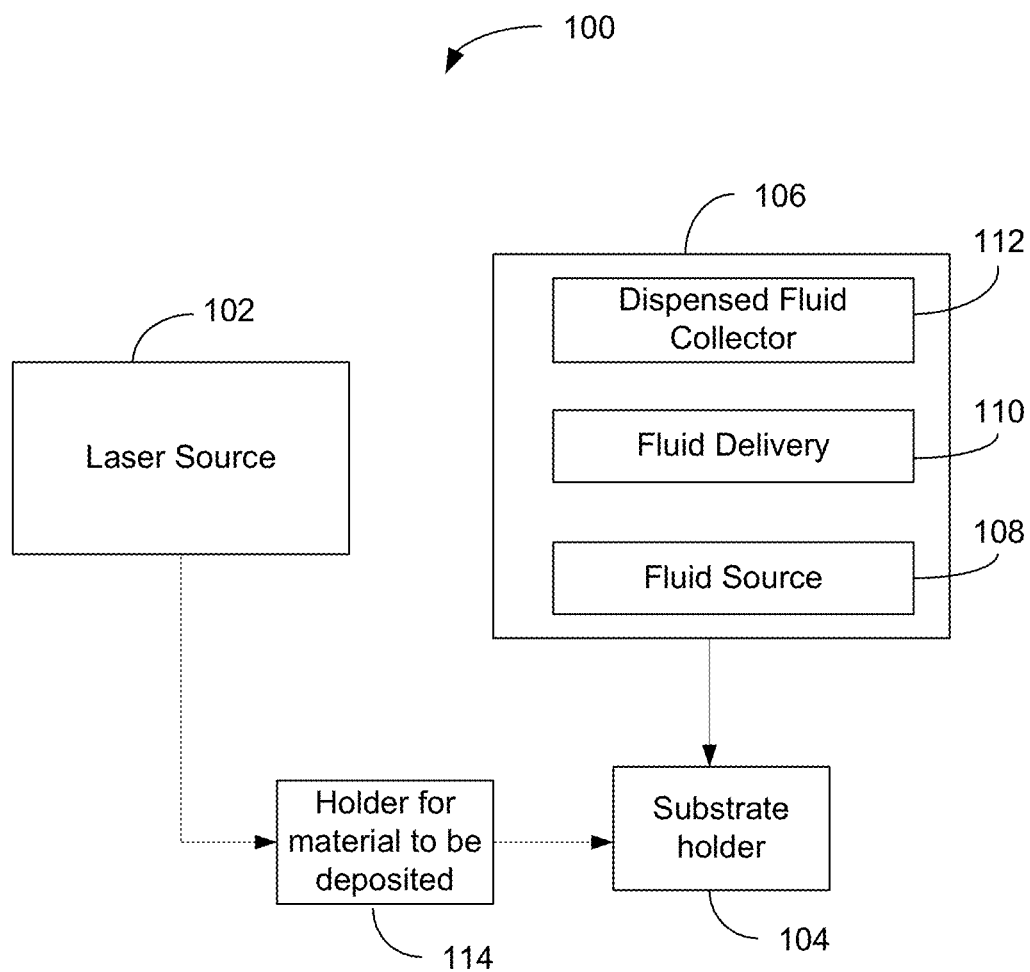
FIG. 1 is a block diagram of a system that can be used to implement the various embodiments of the present invention.

The present disclosure is related to bonding or coating of materials in general. Specifically, techniques disclosed herein provide methods and systems for coating a first material with a second material using a laser.

Coatings produced with chemical and/or physical vapor deposition processes are produced at a slow rate due to mass flux limitations. Low mass flux and roughness amplification can place practical limitations on coating thickness. In addition, these processes can only be used for producing coatings with a relatively narrow range of elemental compositions. Typically, conventional thermal and cold spray coatings have bond strengths on the order of 10,000 pounds per square inch (psi), while the substrate and coating material can have ultimate tensile strengths on the order of 100,000 to 500,000 psi. Furthermore, conventional coating processes such as the thermal spray process, rely on powder feeds through a hypersonic nozzle, which is difficult to manage and operate. For example, in the case of thermal spray, a hydrocarbon or hydrogen fuel is combusted in the nozzle to provide the very high temperatures required for softening of the metallic particles entrained in the jet.

It is desirable to develop new coating processes that can (1) be performed at room temperature; (2) eliminate the problematic powder handling required by flame, plasma, high-velocity oxy-fuel and cold-spray processes; (3) be used with wide range of coating compositions; (4) be used for congruent deposition of alloys; (5) produce interfacial bond strengths comparable to the ultimate tensile strength of the coating and substrate materials, thus achieving an order of magnitude enhancement in bond strength over that possible with more conventional methods; (6) eliminate the residual porosity; (7) have high mass flux rates exceeding 15 mils/$cm^2$/pulse; and (8) utilize the cost-competitive photonic processing method. It is to be noted that that a coating process including some or all of the above-mentioned features will provide a significant advantage over conventional processes.

Techniques described herein achieve some or all of the characteristics described above. Embodiments of the present invention can be used for the uniform and patterned deposition of functional films and coatings with exceptionally strong interfacial bonds. In addition to the deposition of various metal and metal alloy coatings, embodiments of the present invention can be used for congruent deposition of compound semiconductors, including those used in the fabrication of photovoltaic and thermoelectric devices. For example, the processes described here can be used for the high-rate ambient-temperature congruent deposition of semi-conductors, e.g., $(Bi,Sb)_2(Te,Se)_3$, doped-PbTe, and similar thermoelectric materials, to build the macroscopically thick p-n junctions required for construction of a thermoelectric device. In this instance, the target material used is a thin foil or tape consisting entirely, or in part of $(Bi,Sb)_2(Te,Se)_3$, doped-PbTe, or similar thermoelectric material. In some embodiments, this process can also be used for the high-rate congruent deposition of materials such as amorphous Si, CdTe and related compounds that can be used for photovoltaic conversion.

Many advantages can be realized by using the embodiments described herein. Certain embodiments of the present invention can be used for a variety of applications, e.g., refractory metal coatings with exceptional high-voltage standoff characteristics on high-conductivity low-voltage-standoff metallic substrates. In addition, techniques described herein can be used to deposit tantalum on copper for rail gun applications. Some embodiments of the present invention can be used for coating of ships and aircraft structural materials with other more corrosion, erosion, and cavitation resistant materials, such as titanium alloys and iron-based amorphous metals. For example, iron-based amorphous metals such as SAM2X5 and SAM1651 have both exceptional wear resistance, due to their extreme hardness, as well as exceptional corrosion resistance, due to both their composition and amorphous structure. For example, a conventional corrosion-resistant nickel-based alloy such as Alloy C-22 has a Vickers hardness number of 250HVN, whereas corrosion resistant SAM1651 and SAM2X5 manufactured using embodiments of the present invention can have Vickers hardness number ranging from about 1100HVN to about 1300HVN. By coating these relatively inexpensive high-performance materials over a less corrosion-resistant softer structural material using the techniques described herein, substantial performance advantages can be achieved. Coatings produced using the embodiments described herein may overcome many of the limitations of more conventional coatings, such as relatively weak interfacial bonds and porosity that develops during more conventional processing such as flame spray, plasma spray, high velocity oxy-fuel (HVOF) deposition and cold-spray.

Certain embodiments of the present invention use a high peak power laser to accelerate a thin film of dense metal foil to a hypersonic velocity toward the intended substrate, with a controlled shearing angle relative to an interface between the film and a surface of the substrate. Upon impact, the kinetic energy from the accelerated foil enables the formation of an alloyed interface with interfacial deformation and roughening providing additional interfacial bond strength due to mechanical interlocking of the coating and substrate. It is to be noted that neither the temperature of the thin film material nor that of the substrate is substantially raised during the process; thus phase changes or alloy composition changes do not occur due to the coating process described herein. Thus, this process allows for manufacturing strongly bonded coatings of alloys and materials that might not otherwise be possible.

FIG. 1 illustrates a system 100 for coating a first material over a second material according to an embodiment of the present invention. System 100 includes a laser source 102, a substrate holder 104 for holding the first material, a fluid dispenser sub-system 106, and a holder for the second material 114.

Laser source 102 can include a high peak power laser such as Nd:glass laser. In some embodiments, laser source 102 can deliver a laser beam that has peak power in the range of 1 GW from an output of 20 Joules and pulse duration of about 20 nanoseconds. Laser source 102 can be a pulsed laser that can deliver laser pulses with a high repetition rate of about 4-5 Hz and a continuous duty cycle. It is to be noted that any laser source that can provide a high peak power pulsed laser beam with a high repetition rate can potentially be used. Merely by way of example, in addition to a Nd:glass laser, other lasers suitable for use with embodiments of the present invention may include Nd:YAG, Yb-doped fibers, and excimer lasers such as ArF or KrF. In some embodiments, laser source 102 can be coupled to a precession robot that can manipulate laser source 102 to position the laser beam at various locations on the first material. In some embodiments, laser source 102 can include diode-pumped solid-state lasers such as Nd:glass. In this instance, it may be possible to increase the repetition rate, energy efficiency, and material throughput of the laser deposition process described herein.

Substrate holder 104 can be designed to hold the first material (substrate) on which a coating is to be applied. In some embodiments, substrate holder 104 can be a specialized vice grip that can hold the first material as described below. In sum, substrate holder 104 can be any device that can hold the first material on which a second material is to be deposited. In some embodiments, substrate holder 104 can be coupled to a multi-axis motion control mechanism to move and position substrate holder 104 in different orientations and angles. In one embodiment, substrate holder can be a continuous piece of tape similar to a conveyor belt with small pieces of the second material, e.g., the size of the laser beam, lightly bonded and carried by the tape. During the processing, the tape is advanced one frame for each laser pulse in a manner similar to frames of film in a movie projector. In this way the second material can be used with close to 100% efficiency.

Fluid dispenser subsystem 106 can include a fluid source 108, a fluid delivery system 110, and a fluid collector 112. Fluid source 108 can be e.g., a reservoir used to contain a fluid. In some embodiments, the fluid can be de-ionized water. In other embodiments, the fluid can include a fluorocarbon and/or glycerin. Any fluid that is mostly transparent to the laser light and has a high breakdown potential may be used instead. In some embodiments, the fluid can be delivered at a rate of between 1 cc per second and 5 cc per second at the second material. In some embodiments, fluid delivery system 110 can include a pump to draw the fluid from fluid source 108 and a hose/nozzle to deliver the fluid at the second material. Fluid collector 112, e.g., a pan, can collect the dispensed fluid and return the fluid to fluid source 108. The fluid can be delivered such that the fluid flows over the second material held by holder 114 and forms a thin inertial tamping layer covering at least a portion of the second material. In some embodiments, the inertial tamping layer could be provided by a non-fluid based system such as a thin glass or sapphire layer where the glass and sapphire are transparent to the laser light and may have a high breakdown potential.

Holder 114 can be designed to hold the second material to be deposited adjacent to or on the first material. Holder 114 can be designed using known techniques in the art. In some embodiments, holder 114 may be designed to hold a thin film of the second material. In some embodiments, holder 114 may be designed such that the film of the second material substantially covers a surface of the first material.

Figure 2:
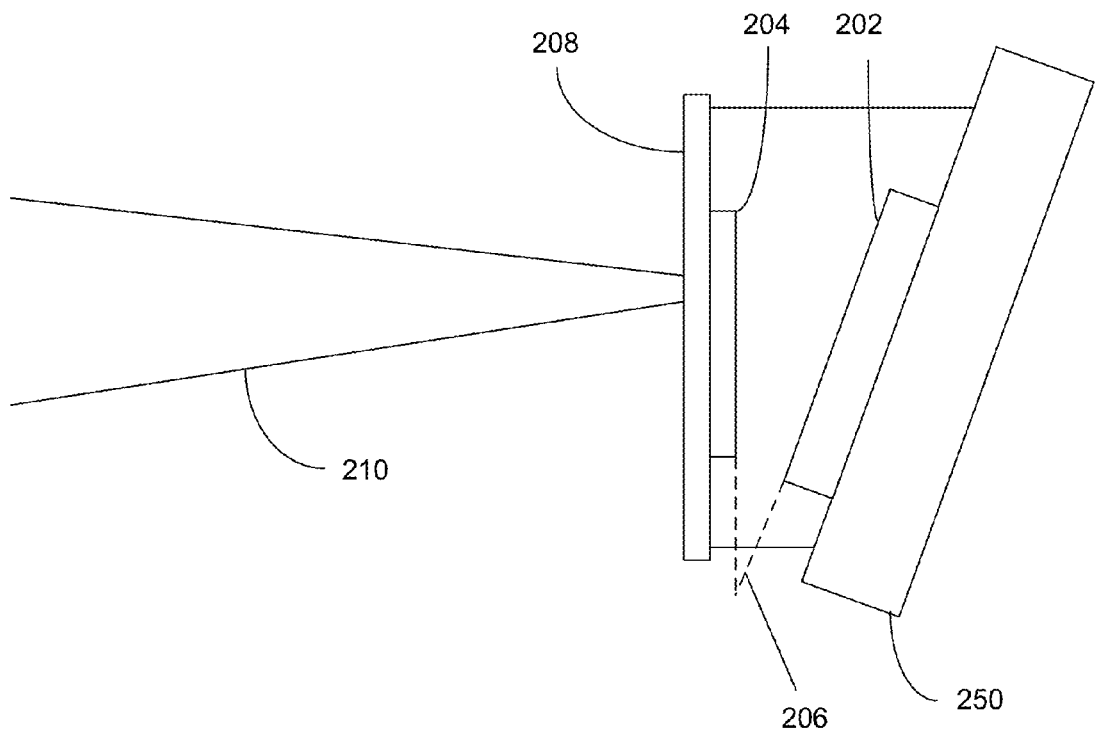
FIG. 2 is a schematic illustrating mechanics of a coating/bonding process according to an embodiment of the present invention.

In some embodiments, system 100 can be used to coat the first material held by substrate holder 104 with the second material. FIG. 2 illustrates a schematic depicting the coating mechanism according to an embodiment of the present invention.

As illustrated in FIG. 2 a first material 202 is held by a substrate holder 250. A second material 204 is positioned over first material 202 at a certain distance. In some embodiments, the distance between first material 202 and second material 204 can be between 1 cm and 5 cm. Second material 204 is positioned at an oblique angle 206 with respect to first material. In some embodiments, angle 206 can range from 5 to 30 degrees. In some embodiments, the thickness of the second material can range between 10 micrometers to about 100 micrometers. A fluid is dispensed over second material 204 such that the fluid forms a thin layer 208 over second material 204. In some embodiments, layer 208 can have a thickness ranging from 1 mm to 2 mm. In order to maintain this thickness of the fluid film, the fluid may be dispensed at a rate ranging from about 1 cc/sec to about 10 cc/sec. In some embodiments, material 204 is fabricated as a thin film/foil.

A laser beam 210 is positioned to focus on a portion of second material 204. Laser beam 210 can be shaped in any desired shape, e.g., round, square, rectangle, etc. When laser beam 210 impinges on second material 204, the laser beam generates a high temperature plasma on the surface of second material 204 due to being inertially confined by layer 208, which acts a tamping layer. The high temperature plasma generates a very high pressure. As the plasma pressure builds, the sudden rise in pressure shears a portion of second material 204 substantially equal to the size of the laser beam. In some embodiments, if the second material is approximately the size of the incident laser beam, shearing does not occur and the entire piece of second material is accelerated directly toward the first material. This portion of second material 204 accelerates towards first material 202 at a velocity of several hundred meters per second and at an angle off of normal equal to angle 206. In some embodiments, the velocity can range between 100 m/sec and 800 m/sec. This off normal interaction causes a shearing action between second material 204 and the surface of first material 202 generating a strong interwoven bond between the two materials. As described above, laser beam 210 is applied in a pulsed manner with the pulse duration being between 10 ns and 50 ns.

In some embodiments, the laser beam is positioned at a first location on the second material. The laser beam is then turned on for the pulse duration. After the second material at the first location has been bonded onto the underlying first material, the laser beam is positioned at a second location on the second material and turned on again for the pulse duration. After the portion of the second material at the second location is deposited onto the first material, the laser beam is moved and focused at a third location on the second material. In this manner, the entire surface of the first material can be coated one portion at a time. Such multi-layer coverage and overlapping coverage may be needed based on the application. In some embodiments, the laser beam spot size can range between 1 mm-by-1 mm to about 1 cm-by-1 cm.

The mechanism described above is now explained using aluminum (Al) as the second material that is deposited on to a first material, e.g., ceramic, and where the fluid used is de-ionized water. It is to be noted that Al is used merely to explain the coating/bonding process and embodiments of the present invention should not be limited to Al coating/bonding. As described above, techniques described herein can be used to bond/coat any two dissimilar materials.

The pressure exerted by the plasma produced by the pulsed laser beam can be calculated as $$P = 0.1 * I^{0.5} * (\alpha/3)^{1/2} * Z^{1/2} \quad (1)$$

Where P=pressure in kbars; I=intensity of the laser beam in GW/cm$^2$; α=empirical constant describing the distribution between the thermal energy and the energy spent on ionization (~0.25 for typical applications); Z=water-Al interface impedance, which is 0.3*10$^6$ g/sec-cm$^2$. Substituting the above values in equation (1), we can calculate the pressure (P) to be approximately 15.8√I(GW/cm$^2$).

$$P = 15.8\sqrt{I}$$

The intensity (I) of the laser beam can range between 0.5 and 10 GW/cm$^2$. Thus, pressure (P) can range between 11 and 50 kbars.

As described above, the laser beam is operated in a pulsed manner. In some embodiments, the pulse duration can range between 10 and 50 ns. In our example for Al, we consider the pulse duration to be 20 ns. The pressure pulse duration of the plasma generated by the laser beam is generally 2.5 to 3 times the duration of the laser pulse because the plasma is inertially confined by the fluid. Thus for a 20 ns laser pulse, the pressure pulse duration (τ) can range between 50 ns and 60 ns. We will use τ=50 ns in our example. The momentum transferred to the Al film can be given by $$M = P * \tau \quad (2)$$

The final velocity of the Al film can be calculated as $$u = P\tau/pd \quad (3)$$

where d=thickness of the Al film and p=2.7 g/cm³. Thus, solving for the velocity yields $$u=290*\sqrt{I}/(d/100\ \mu m)*\alpha^{1/2}*(\tau\sqrt{I}/d) \quad (4)$$

For the above equation to be valid, the pulse duration should be shorter than the time it takes for the shock wave created by the laser beam to travel to the other/rear end of the Al film and back. This travel time is given by 2 d/s, where s is the speed of sound in Al, which is approx 5 km/sec. When the reflected wave comes back to the surface, it increases the gap between the Al film and the plasma and the plasma pressure (P) drops as the plasma expands into the free space created by the increased gap. So instead of using the pressure pulse duration of 2 times the duration of the laser pulse, it is more accurate to use τ=2 d/s in equation (3) above. Using the new value for τ, we get $$u=230(m/sec)\sqrt{I(GW/sec^2)} \quad (5)$$

In this embodiment, the velocity (u) is independent of film thickness.

As described above, the large velocity results in very strong acceleration of the Al material towards the first material resulting in the Al bonding to the first material. However, there is a certain range of impact velocities that may be more effective for bonding. For instance, for an effective bond to occur between two materials, the kinetic energy may have to be large enough to induce stresses above the plastic deformation threshold of the first material (i.e. the material on which the coating is applied). The kinetic energy can be expressed by the relation $$\rho u^2 > Y \quad (6)$$

Where Y=material shear strength. In practice, there may be an upper limit for the velocity. For instance, if the motion of material used for the coating/bonding becomes too fast, i.e. the velocity is very high, it may result in formation of voids in the bonding area and quality of the bond may degrade. Effective velocities for some of the materials, obtained from explosive bonding experiments, are provided below for reference. For example, for Al 1100-0 the minimum velocity is about 180 m/sec and the maximum velocity can be about 540 m/sec and for Al 6061-T6 the minimum velocity is about 340 m/sec and the maximum velocity can be about 480 m/sec.

As described above, in some embodiments, the material to be deposited is placed at an angle of between 5 and 30 degrees compared to the substrate material. This range of angle provides the most effective bonding between the two materials. The angle between the material to be deposited and the substrate may determine the effectiveness of the deposition. The angle determines the amount shear motion of the material to be deposited relative to the substrate material. If the angle is too small, the shear motion may not be generated or may be too small to effectively deposit the material on the substrate material. On the other hand, if the angle is too large, the shear motion generated when the laser beam hits the material to be deposited may be uneven causing some portion of the material to accelerate at a higher velocity than some other portion. This may result is an uneven deposition of the material on the substrate material creating gaps or voids on the surface of the substrate material. Thus, the angle between the material to be deposited and the substrate material has to be such that the shear motion caused by the laser beam in the material to be deposited accelerates the relevant portion of the material to be deposited in manner to so as to cause even and effective deposition of the material on the substrate material.

Figure 3:
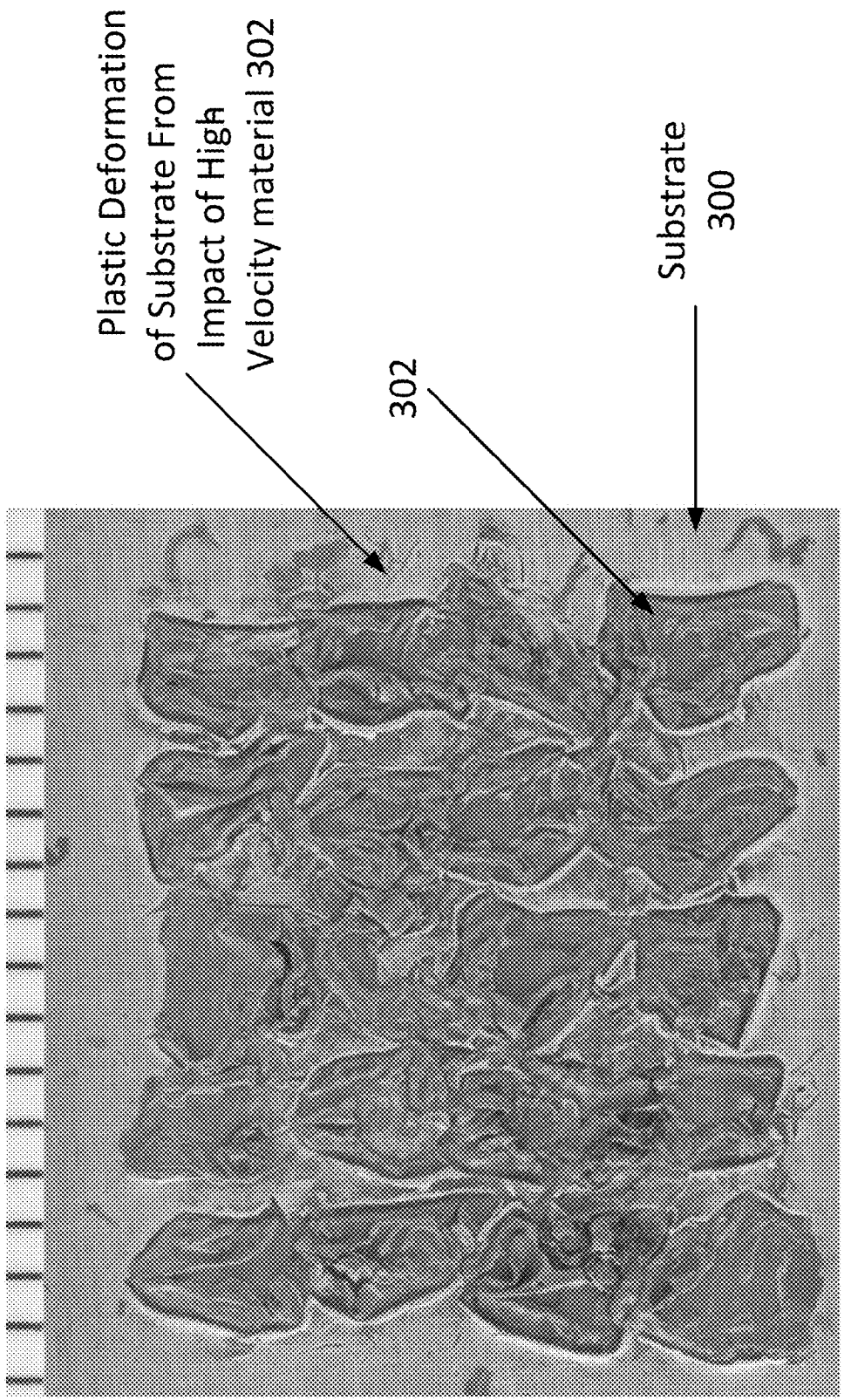
FIG. 3 is a micrograph illustrating result of a coating/bonding process performed according to an embodiment of the present invention.

FIG. 3 is an exemplary micrograph illustrating the result of the coating/deposition process described above. As seen in FIG. 3 a material 302 is deposited onto a substrate 300. In the particular example illustrated in FIG. 3, substrate 300 is copper and metal 302 is Tantalum. Also seen in FIG. 3 is evidence of the plastic deformation caused in substrate 300 due to impact with high velocity material 302. Also, FIG. 3 illustrates the plastic flow in deposited material 302. The impact of high velocity material 302 causes plastic deformation on the substrate 300 surface and the shear forces generated as a result enable material 302 to bond to the substrate 300.

Figure 4:
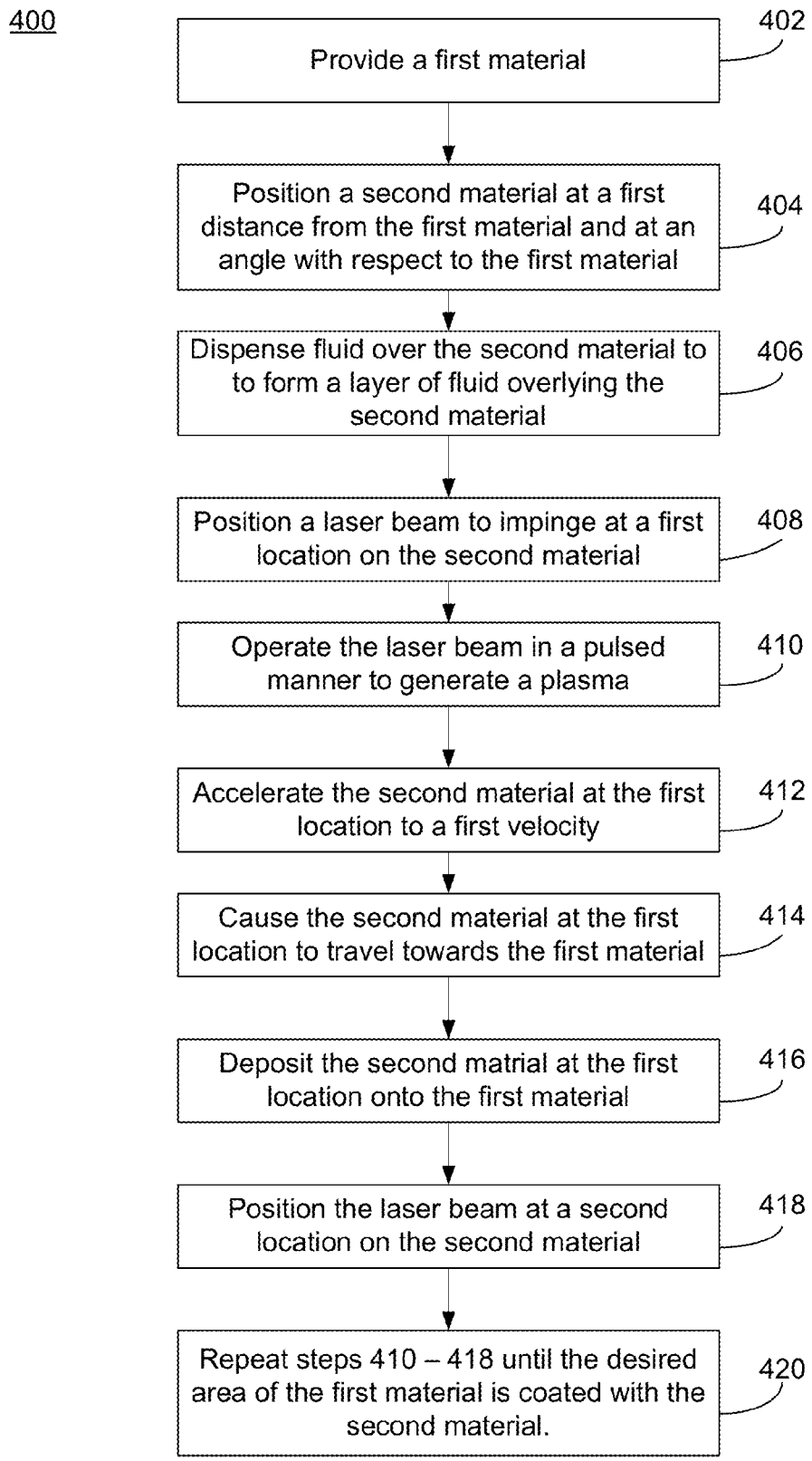
FIG. 4 is a flow diagram of a process for coating a first material with a second material according to an embodiment of the present invention.

FIG. 4 is a flow diagram of a process 400 for coating a first material with a second material according to an embodiment of the present invention. Initially, a first material on which the coating is to be performed is provided (402). The first material may have an upper surface on which the second material is to be coated. The second material is positioned at predetermined distance above the first material (404). In some embodiments, the second material may overlay the entire upper surface of the first material. In other embodiments, the second material may overlay only a portion of the upper surface of the first material. As described above, the second material is placed at an oblique angle with respect to the first material. Thereafter a fluid, e.g., de-ionized water, can be continually dispersed over the second material such that it forms a thin layer, e.g., 1 mm, over the second material (406). Although water is used in some exemplary embodiments, other fluids can be utilized. A laser beam is then directed to and images at a first location on the second material (408). The laser beam is operated in a pulsed manner to generate a plasma at the first location (410). The generated plasma also generates a high pressure, as described above. The high pressure causes a shock wave that accelerates a portion of the second material at the first location to a first velocity (412). The portion of the second material at the first location travels with the first velocity towards the upper surface of the first material (414). Thereafter, the portion of the second material at the first location collides with a section of the upper surface of the first material and causes plastic deformation of the section of the upper surface of the first material. Thereafter, the portion of the second material at the first location is deposited on the section of the upper surface of the first material (416).

The laser beam may be then directed to and imaged at a second location on the second material (418) and the entire process may be repeated (420) until a desired area of the first material is coated with the second material. In some embodiments, process 400 can be repeated a number of times to coat the entire upper surface of the first material. One skilled in the art will realize that the number of repetitions of process 400 for coating a surface of a material will depend on the size of the laser beam spot and/or the surface area to be coated.

It should be appreciated that the specific steps illustrated in FIG. 4 provide a particular method of coating a first material with a second material according to an embodiment of the present invention. Other sequences of steps may also be performed according to alternative embodiments. For example, alternative embodiments of the present invention may perform the steps outlined above in a different order. Moreover, the individual steps illustrated in FIG. 4 may include multiple sub-steps that may be performed in various sequences as appropriate to the individual step. Furthermore, additional steps may be added or removed depending on the particular applications. One of ordinary skill in the art would recognize many variations, modifications, and alternatives.

Figure 5:
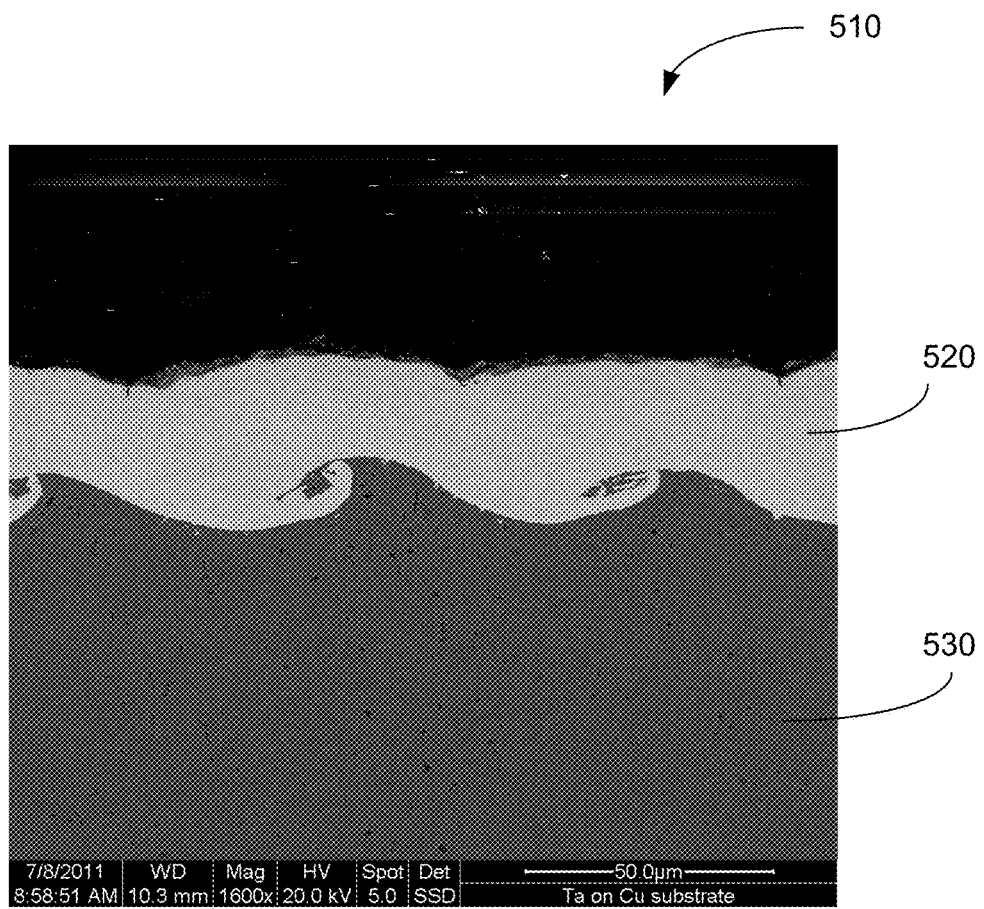
FIG. 5 is SEM cross-sectional view illustrating the bonding interface between a first material and a second material according to an embodiment of the present invention.

The method described above can be used to bond/coat/deposit dissimilar materials onto each other. FIG. 5 is a cross-sectional SEM image illustrating coating of a second material 520 over a first material 530. For example, first material 530 can be copper and second material 520 can be Tantalum. The interface region between first material 530 and second material 520 clearly shows the interlocking of the two materials resulting in a strong bond.

As described above, the techniques described herein can be used to coat any two dissimilar materials or to coat similar materials. Next, several specific applications that may use the coating techniques disclosed herein are described. It is to be understood, that the examples described below are for illustration purposes only and are not meant to be exhaustive. One of ordinary skill in the art would recognize many variations, modifications, and alternatives.

High-Rate Ambient-Temperature Congruent Deposition of Refractory Metal Alloys—

Deposition of refractory metal coatings onto substrate surfaces is difficult using conventional techniques. Deposition using conventional techniques result in a relatively weak interface bond and a lower density coating. Examples of refractory metals as coating materials include but are not at all limited to: tungsten and tungsten alloys; tantalum and tantalum alloys, such as Ta-2.5 W and Ta-10 W; niobium and niobium alloys; molybdenum and molybdenum alloys; vanadium and vanadium alloys. In some embodiments, Ta on copper coating may be used in rail guns. Some other application may include barrier coatings for high-temperature heat exchangers, and first walls in fusion reactor systems.

In some embodiments, it may be also possible to directly deposit light-weight corrosion-resistant titanium cladding over aluminum substrates, thereby producing a light-weight composite material with extreme corrosion resistance in salt water and salt fog environments for both marine and aerospace applications. It is to be noted that in comparison to many other alloys, titanium-based alloys are known to have exceptional corrosion resistance in seawater.

Deposition of Corrosion, Erosion & Abrasion Resistant Amorphous Metals

Some embodiments of the present invention may be used for forming single and multi-layer coatings for protection from corrosion. For example, a thin layer of titanium coated on to a ship's hull could be a very cost effective means of corrosion prevention yet allow for a conventional ship hull design of steel. Other coating materials of interest may include but are not limited to noble metals: gold, platinum, rhodium, ruthenium, palladium, and silver; stainless steels (e.g., 304, 316), nickel and nickel-based alloys, (e.g., 600), Hastelloy C-4, C-276 and C-22; amorphous metal alloys, including SAM1651 and SAM2X5; coatings for zinc galvanizing; lead and lead alloys; cadmium and cadmium alloys; chromium and chromium alloys; titanium and titanium alloys, such as TiGr2, TiGr7, and TiGr12; ceramic coatings, including but not limited to $Al_2O_3$, $ZrO_2$, $TiO_2$, $SiO_2$, $Ta_3O_4$; and others.

In one embodiment, melt spun ribbons of the amorphous metal can be produced and advanced into a target frame to enable the incident laser beam to ablate the advancing ribbon, thereby providing a continuous source of target material. This may enable continuous coating of the underlying substrate with the amorphous metal. This methodology can be applied to other metals as well, including stainless steel, nickel-based alloy, titanium-alloy, aluminum-alloy, and other such ribbons.

Localized Additive Process for Arresting SCC & Corrosion Fatigue in Critical Components In some embodiments, the coating process described above can be used for crack healing through the directed deposition of aluminum into the cracks of aluminum alloys. For example, commercial jet engine blades, aircraft structural parts and commercial gas and steam turbine blades can be reinforced using the techniques described above to significantly increase their lifetime and protect against fatigue-induced failures.

Conventionally, a process known as "Stop Drilling" is used to temporarily prevent the spread of cracks in components such as aircraft wings. However, stop drilling is a subtractive process in which material is further removed from the weakened structure. In contrast, using an additive process such as the coating process described above, aluminum can be deposited into a crack in the affected material and the crack root can be blunted, thereby adding material to the weakened structure. Thus, the crack stress riser can be blunted and the component cross-section strengthened.

Corrosion Protection Coatings

In some embodiments, single and/or multi-layer coatings for protection from corrosion may be applied onto a base material. Materials used for such corrosion-resistant coatings include but are not limited to noble metals including: gold, platinum, rhodium, ruthenium, palladium, and silver; stainless steel, (e.g., 304, 316); nickel and nickel-based alloys (e.g., 600, Hastelloy C-4, C-276 and C-22); amorphous metal alloys (e.g., SAM1651 and SAM2X5); coatings for zinc galvanizing; lead and lead alloys; cadmium and cadmium alloys; chromium and chromium alloys; titanium and titanium alloys (e.g., TiGr2, TiGr7, and TiGr12); ceramic coatings (e.g., Al20s, Zr02, Ti02, Si02, Tas04), and others. In some embodiments, some of these coatings with appropriate morphology may also be used in applications such as reflective and antireflective optical coatings; and target surfaces for ICF targets.

In some embodiments, techniques disclosed herein may be used for deposition of high-performance corrosion resistant amorphous metal coatings onto susceptible substrates. Such coatings are superior to the conventional technology used for the deposition of these coatings. The conventional technology involves the use of thermal spray techniques, such as high-velocity oxy fuel (HVOF) processes. In an HVOF process hot hypersonic gases and particles are directed towards a surface to be deposited on the surface. In the HVOF process, the temperature control of the surface being coated is very challenging, and substrates may be destroyed due to excessive heating. Embodiments of the present invention provide a process that avoids the high heat load on the substrate thereby resulting in a more sustainable and reliable method for coating.

Other possible application where the techniques disclosed herein can be used are (a) deposition of thin films with well developed surface for promoting adhesion in subsequently deposited layers, (b) direct deposition of conductive patterned interconnects on printed circuit boards and hybrid microcircuits for the purpose of both initial fabrication and subsequent repair, (c) direct deposition of conductive patterned interconnects for the initial fabrication, and subsequent repair of solid-state energy conversion and storage devices, including but not limited to thermoelectric generators, Peltier coolers, and photovoltaic devices, (d) deposition of active anode materials, active cathode materials, and separators for electrochemical energy conversion and storage devices, including but not limited to lithium ion batteries, solid state batteries, and solid oxide fuel cells, (e) deposition of both n-type and p-type materials for thermoelectric energy conversion and storage, including but not limited to bismuth-antimony-telluride-selenide type (Bi, Sbh(Te,Se)s, PbTe, and SiGe alloys, and (f) deposition of both n-type and p-type materials for photovoltaic energy conversion and storage, including but not limited to silicon (Si), cadmium telluride (CdTe), and other similar materials. It is to be noted that the various applications discussed above are exemplary and are not meant to limit the scope of the various embodiments of the present invention.

In some embodiments, instead of using a fluid as a tamper material to confine the plasma generated by the laser, other materials such as glass may also be used. For example, glass, fused silica, or sapphire may be used to generate higher pressure and film velocity. In some embodiments, a multilayer coating can be formed on a substrate material by repeating the process multiple times providing a thicker coating. Although the embodiments described above relate to coating one material with another, in some embodiments, multiple materials may be coated onto one another using the techniques described herein. For example, a first material can be coated with a second material and the resultant combination can be coated with a third material. This may provide a multi-layered coating using different materials. The high impact velocity and pressure can make a deposited layer more dense and stronger than the initial deposited materials.

In some embodiments, it may be possible to deposit a thin film of material onto a substrate. In this instance, the material may be melted during the acceleration process turning the material into tiny droplets. These droplets can then be deposited onto the surface of the substrate. Since the size of droplets is very small, e.g., few tens of microns, it may be possible to deposit a thin uniform film on the substrate. Due to fast freezing upon contact with the substrate, the metal coating can have an amorphous structure and superior material properties.

This description of the invention has been presented for the purposes of illustration and description. It is not intended to be exhaustive or to limit the invention to the precise form described, and many modifications and variations are possible in light of the teaching above. The embodiments were chosen and described in order to best explain the principles of the invention and its practical applications. This description will enable others skilled in the art to best utilize and practice the invention in various embodiments and with various modifications as are suited to a particular use. The scope of the invention is defined by the following claims.

What is claimed is:

1. A method comprising:
providing a substrate having an upper surface and an opposing lower surface;
positioning a first material over the upper surface of the substrate at a first distance, the first material being positioned at an oblique angle with respect to the upper surface of the substrate;
providing a tamping layer over the first material, wherein the tamping layer is characterized by a first thickness, wherein providing the tamping layer comprises flowing de-ionized water over the first material, the de-ionized water forming the tamping layer;
directing a laser beam to be incident at a first location of the first material for a first duration;
generating a first pressure at an interface region between the tamping layer and the first material;
accelerating the first material to a first velocity and towards the upper surface of the substrate; and
depositing the first material on at least a first portion of the upper surface of the substrate.

2. The method of claim 1 further comprising:
moving the laser beam to be incident on a second location of the first material; and
depositing the first material on a second portion of the upper surface of the substrate.

3. The method of claim 1 further comprising depositing a second material on the at least first portion of the upper surface of the substrate to form a multi-layered structure.

4. The method of claim 1 wherein the substrate comprises at least one of a metal, a ceramic, or a composite material.

5. The method of claim 1 wherein the first distance ranges from about 1 mm to about 5 mm.

6. The method of claim 1 wherein the first material is intermixed with the first portion of the upper surface of the substrate.

7. The method of claim 1 wherein the first velocity is between 100 meters/sec and 500 meters/sec.

8. The method of claim 1 wherein the oblique angle is between 5 and 30 degrees.

9. The method of claim 1 wherein the first thickness is between 1 mm and 2 mm.

10. The method of claim 1 wherein the first duration is between 10 ns and 50 ns.

11. The method of claim 1 wherein the first pressure is about 20 kilobar.

12. A method comprising:
providing a substrate having a surface;
placing a film comprising a first material at a first distance from the surface of the substrate;
flowing a liquid over the film such that the liquid covers the film;
providing laser energy at a first location of the film;
generating a first pressure at an interface region of the liquid and the film proximate to the first location;
accelerating the first material at the first location to a first velocity;
directing the first material at the first location towards the surface of the substrate;
causing the first material at the first location to impact the surface of the substrate in a first region; and
bonding the first material at the first location to the first region of the surface, wherein bonding comprises:
causing plastic deformation at the first region of the surface of the substrate;
causing shear flow in the first region of the surface of the substrate; and
intermixing of the first material at the first location with substrate material at the first region of the surface of the substrate.

13. The method of claim 12 further comprising bonding a second material to the substrate at the first region.

14. The method of claim 12 wherein placing the film comprising the first material further comprises:
providing a continuous film including the first material;
traversing the continuous film across the surface of the substrate; and
moving the continuous film one frame at a time over the surface of the substrate.

15. The method of claim 12 wherein the first material is positioned at an oblique angle with respect to the upper surface of the substrate.

16. The method of claim 15 wherein the oblique angle is between 5 and 30 degrees.

17. The method of claim 12 wherein the liquid comprises de-ionized water.

18. A method of depositing a material, the method comprising:
providing a substrate having an upper surface;
positioning the material over and at an oblique angle with respect to the upper surface of the substrate;
flowing a liquid over the material to form a tamping layer;

directing a laser beam to be incident at a first location of the material;

generating a pressure at an interface region between the tamping layer and the material;

accelerating the material towards the upper surface of the substrate; and depositing the material on at least a first portion of the upper surface of the substrate.

19. The method of claim 18 further comprising:

moving the laser beam to be incident at a second location of the material; and depositing the material on a second portion of the upper surface of the substrate.

20. The method of claim 18 further comprising depositing a second material on the at least a first portion of the upper surface of the substrate to form a multi-layered structure.

21. The method of claim 18 wherein the substrate comprises at least one of a metal, a ceramic, or a composite material.

22. The method of claim 18 wherein the liquid comprises de-ionized water.

23. The method of claim 18 wherein the oblique angle is between 5 and 30 degrees.

\* \* \* \* \*